(12) United States Patent
Nishimura

(10) Patent No.: US 7,468,783 B2
(45) Date of Patent: Dec. 23, 2008

(54) EXPOSURE APPARATUS, CONTROL METHOD FOR THE SAME, AND DEVICE MANUFACTURING METHOD

(75) Inventor: Mitsuo Nishimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/948,550

(22) Filed: Nov. 30, 2007

(65) Prior Publication Data
US 2008/0129977 A1 Jun. 5, 2008

(30) Foreign Application Priority Data
Dec. 4, 2006  (JP) ............................. 2006-327630

(51) Int. Cl.
G03B 27/62 (2006.01)
G03B 27/58 (2006.01)
H02K 41/00 (2006.01)
(52) U.S. Cl. .............................. 355/75; 355/72; 310/12
(58) Field of Classification Search ............. 355/53.72, 355/76; 310/10, 12, 90.5
See application file for complete search history.

(56) References Cited

U.S. PATENT DOCUMENTS

| 7,126,666 | B2 * | 10/2006 | De Weerdt et al. | ............ 355/53 |
| 7,126,674 | B2 * | 10/2006 | Butler | ......................... 355/72 |
| 7,259,836 | B2 * | 8/2007 | Ohishi | ......................... 355/75 |
| 7,288,859 | B2 * | 10/2007 | Hazelton | ..................... 310/12 |

FOREIGN PATENT DOCUMENTS

JP        2004-079639        3/2004

* cited by examiner

Primary Examiner—Hung Henry Nguyen
(74) Attorney, Agent, or Firm—Morgan & Finnegan, L.L.P.

(57) ABSTRACT

An exposure apparatus which can change a reticle efficiently with a simple arrangement is provided. When changing the reticle, a table is moved to a predetermined change operation position. At this time, a second magnet is retreated to a position where a repulsion force generated by a first magnet and the second magnet does not act on the table. After the reticle is changed, the second magnet is restored to a position where a repulsion force generating unit exerts a repulsion force upon the table.

7 Claims, 8 Drawing Sheets

F I G. 3A 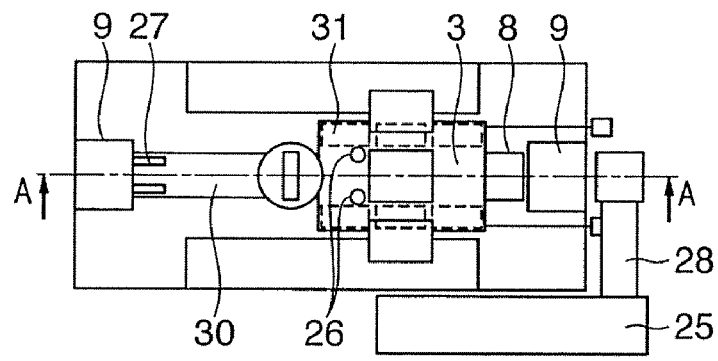
F I G. 3B 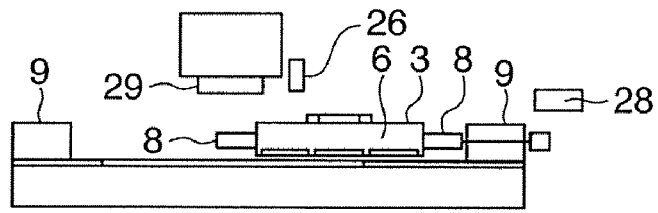
F I G. 3C 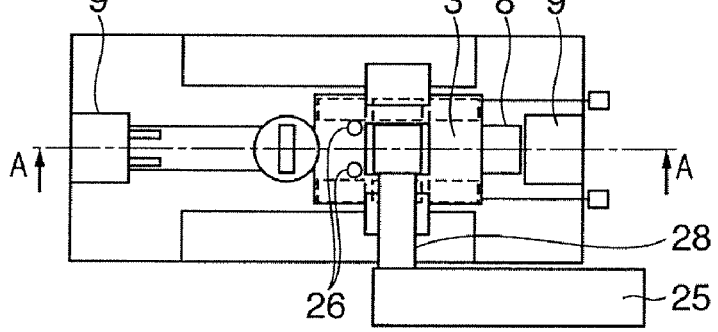
F I G. 3D 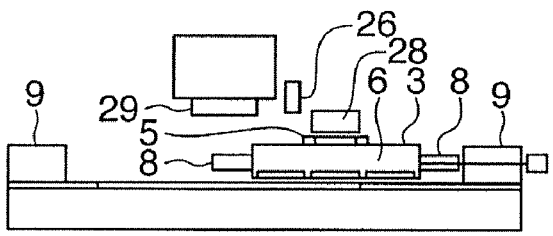
F I G. 3E 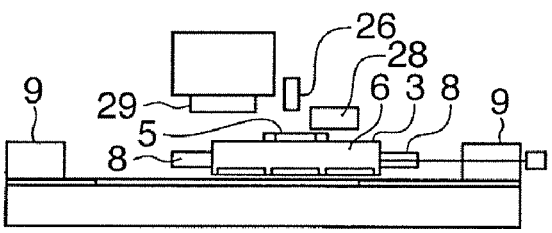
F I G. 3F 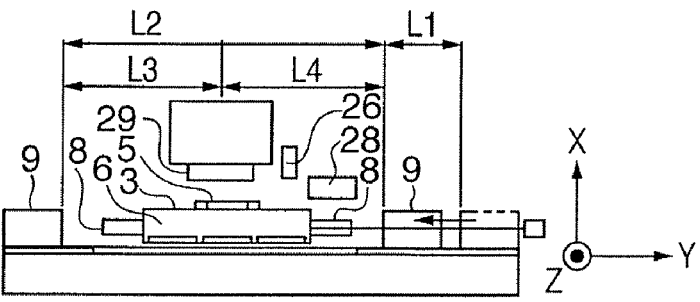

F I G. 4
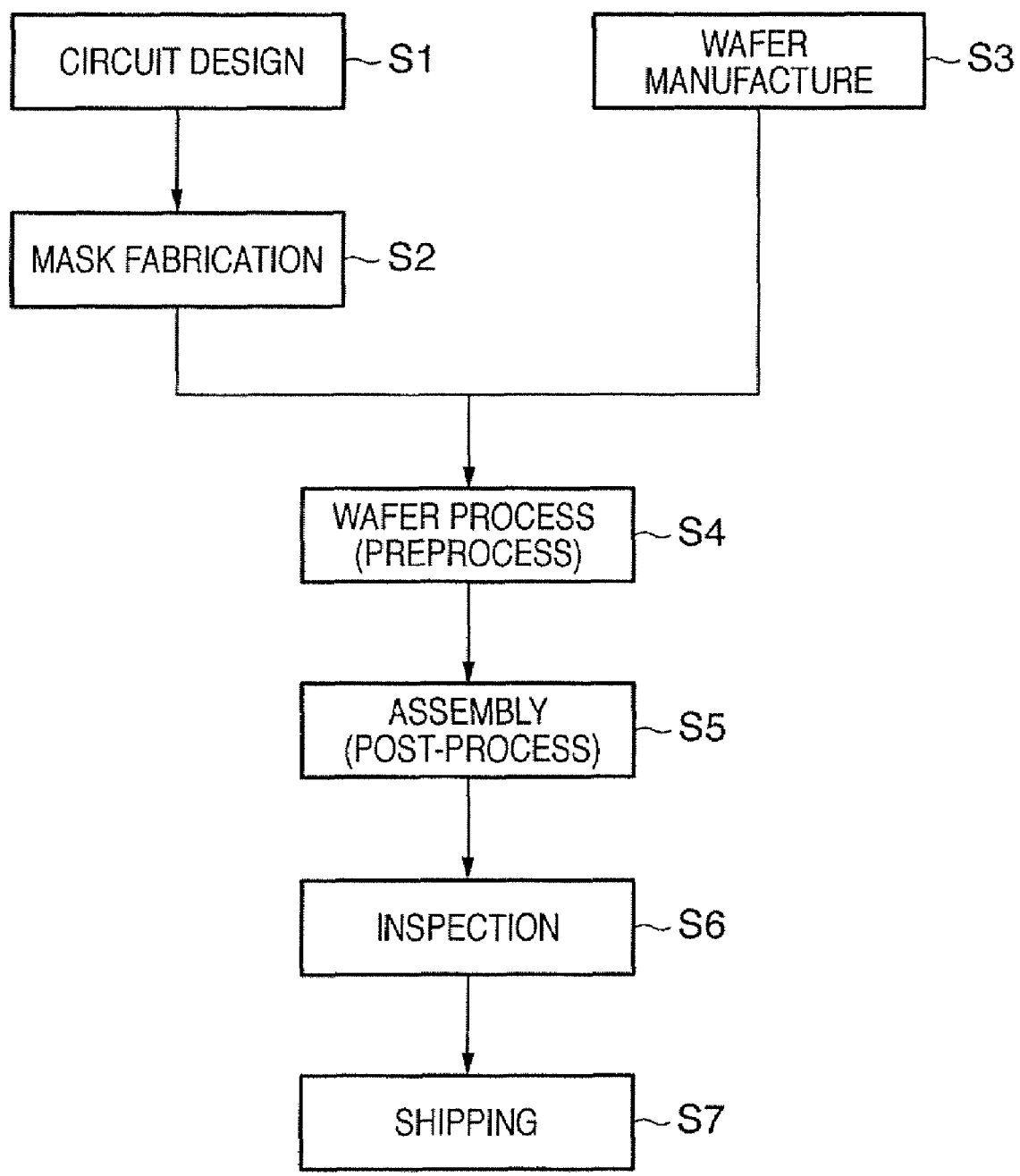

Background Art

Background Art

Background Art

EXPOSURE APPARATUS, CONTROL METHOD FOR THE SAME, AND DEVICE MANUFACTURING METHOD

BACKGROUND OF THE INVENTION

1. Field of the Invention

The present invention relates to an exposure apparatus which scans both a substrate such as a wafer and an original such as a reticle to expose and transfer a pattern on the reticle onto the wafer substrate, a control method for the same, and a device manufacturing method.

2. Description of the Related Art

An exposure apparatus to manufacture a semiconductor integrated circuit is desired to simultaneously cope with a high integration density and improve the number of wafers to expose per unit time, that is, the throughput, thereby providing a more inexpensive chip. To satisfy these demands, currently, is most popular to use a scanning exposure apparatus. This apparatus projects only a rectangular band-like region of a pattern on a reticle onto a wafer substrate or the like, and scans both the reticle and wafer substrate in a sync manner to transfer the entire pattern onto the wafer substrate. This exposure apparatus has a reduced projection system with a magnification of ¼ to ⅕, limits the irradiation region of exposure light to a rectangular band-like region, and is provided with a stage which scans the reticle and wafer substrate with a speed ratio equal to the reduction magnification of the reduced projection system.

FIGS. 6 and 7 are respectively an upper perspective view of a general scanning exposure apparatus and its sectional view taken along a Y-Z plane. This exposure apparatus has an exposure light source and an optical illumination system (neither is shown), and a reticle stage 100, reduced projection system 110, and wafer stage 120.

The reticle stage 100 includes a base 101, a table 103 for mounting a reticle 104 thereon, and linear actuators 105 such as linear motors. The linear actuators 105 reciprocally move the table 103 on the base 101 in the Y direction. The wafer stage 120 includes a base 121, a table 127 for mounting a wafer substrate 128 thereon, and linear actuators 123 such as linear motors. The linear actuators 123 reciprocally move the base 121 on the base 121 in both the X and Y directions.

The reduced projection system 110 is fixed to a lens barrel supporting member 111. Laser interferometers 106 and 130 are fixed to the lens barrel supporting member 111 through support pillars. Mirrors (not shown) set on the tables 103 and 127 respectively reflect laser beams coming from the laser interferometers 106 and 130 to measure the positions of the reticle stage 100 and wafer stage 120. The position measurement results are respectively fed back to the linear actuators 105 and 123.

The linear actuators 105 and 123 respectively, reciprocally move the reticle stage 100 and wafer stage 120 on the bases 101 and 121. During pattern exposure of the reticle 104 with exposure light, the scanning speeds of the reticle stage 100 and wafer stage 120 are controlled to be constant.

The scanning exposure apparatus as described above faces a demand, which becomes stronger every year, of further improving the throughput to increase the productivity. To meet this demand, Japanese Patent Laid-Open No. 2004-79639 discloses a moving stage apparatus in which, to enable a reticle stage to move at a higher speed, repulsion members made of magnets are set at the stroke ends of the stage, thereby generating a large thrust and maintaining the high speed.

FIGS. 8A and 8B show the arrangement of this conventional moving stage apparatus. As shown in the plan view in FIG. 8A, a base guide 132 is fixed to a main body base 131. The base guide 132 supports a table 134 for mounting a work 133 thereon such that the table 134 is movable in one direction with respect to the base guide 132.

Bearings 144 arranged between the upper surface of the base guide 132 and the lower surface of the table 134 regulate the posture of the table 134. A semiconductor exposure apparatus for which high-accuracy alignment is required employs air bearings as the bearings 144. Linear motor movable elements 135 are fixed on the two sides of the table 134. Linear motor stators 136 face the linear motor movable elements 135 in a non-contact manner. Each linear motor stator 136 is fixed to the main body base 131 through legs 137 at two ends. The position of the table 134 is measured as a laser interferometer radiates light to a mirror 146.

This moving stage apparatus comprises repulsion magnet units each as shown in FIG. 8B. Repulsion movable elements 147 each comprising a movable magnet holder 138 and movable magnet 139 are fixed in front of and behind the table 134. The movable magnet 139 is a plate-like unipolar permanent magnet magnetized in the vertical direction. In this prior art, the upper side of the movable magnet 139 is magnetized as an N pole. The repulsion movable elements 147 serve as insertion magnets and react with corresponding repulsion stators 140 arranged on the base guide 132 to apply repulsion forces to the table 134, thereby accelerating and decelerating the table 134.

In each repulsion magnet unit, upper and lower magnets 142 sandwich the respective magnetic pole surfaces of the movable magnet 139 from the two sides to cancel the repulsion forces in the opposing directions. To correspond to the repulsion movable elements 147, the repulsion stators 140 which accelerate or decelerate the table 134 are fixed on the base guide 132. The repulsion stators 140 are arranged one unit at each end of the stroke of the table 134.

Each repulsion stator 140 forms a set magnet comprising an upper yoke 141, the upper magnet 142, horizontal yokes 143 on two sides, the lower magnet 142, and a lower yoke 141. The upper and lower magnets 142 are plate-like unipolar permanent magnets magnetized in the vertical direction, in the same manner as the repulsion movable elements 147. Note that the magnets 142 are arranged such that the same polarity poles face the same polarity poles of the repulsion movable element 147. More specifically, the magnets 142 are arranged such that the lower surface of the upper magnet 142 is an N pole and that the upper surface of the lower magnet 142 is an S pole. The upper yoke 141, horizontal yokes 143, and lower yoke 141 are provided so that the magnetic fluxes of the upper and lower magnets 142 circulate through them sideways.

The upper and lower magnets 142 are set at a gap slightly larger than the thickness of the repulsion movable magnet 139. The inner gap of the two horizontal yokes 143 is maintained to be larger than the width of the movable magnet 139. Thus, the repulsion movable magnet 139 is inserted in a non-contacting manner in a hole formed by the upper and lower magnets 142 and two horizontal yokes 143.

A stage that uses these repulsion magnet units achieves a higher speed and smaller heat generation.

According to Japanese Patent Laid-Open No. 2004-79639, at one stroke end of the table 134, the movable magnet 139 enters the corresponding repulsion stator 140 to impart a repulsion force against movement of the table 134.

Assume a case wherein a reticle changer to change a reticle automatically is mounted on the exposure apparatus described in Japanese Patent Laid-Open No. 2004-79639. In this case, when changing the reticle, the reticle changer should not interfere with an optical illumination system. Usually, the optical illumination system is arranged at the stroke center of the table 134. The position where the reticle changer changes the reticle is accordingly set at the stroke end side on the table 134.

As described above, the stroke end of the table 134 is the position where the mutual operations of the movable magnet 139 and repulsion stator 140 generate a repulsion force in the table 134. Thus, when changing the reticle, a mechanism to hold the table 134 against the repulsion force is separately necessary, which increases the cost. If such a mechanism holds the table 134 locally, it may deform the movable magnet 139 and table 134, and even a reticle to be placed.

SUMMARY OF THE INVENTION

It is, therefore, an object of the present invention to enable, for example, an exposure apparatus having a repulsion force generating means for obtaining a repulsion force against the thrust of a reticle stage, to change a reticle efficiently with a comparatively simple arrangement. Other objects and advantages of the present invention will become apparent from the following detailed description.

According to one aspect of the present invention, an exposure apparatus comprises a table configured to be movable on a base guide in a first direction and to place a reticle thereon, a repulsion force generation unit having a first magnet provided to an end of the table in the first direction, and a movable second magnet provided to an end of the base guide in the first direction, thereby exerting a repulsion force generated by the first and second magnets upon the table at an end of a moving stroke of the table in the first direction, a driving unit configured to reciprocally drive the table in the first direction while the repulsion force generation unit exerts the repulsion force on the table, and a control unit configured to retreat the second magnet to a position where the repulsion force generated by the first and second magnets do not act upon the table when moving the table to a change operation position for changing a reticle.

According to another aspect of the present invention, an exposure apparatus comprises a table configured to be movable on a base guide in a first direction and to place a reticle thereon, a repulsion force generation unit having a first magnet provided to an end of the table in the first direction, and a movable second magnet provided to an end of the base guide in the first direction, thereby exerting a repulsion force generated by the first and second magnets upon the table at an end of a moving stroke of the table in the first direction, a driving unit configured to reciprocally drive the table in the first direction while the repulsion force generation unit exerts the repulsion force upon the table, and a control unit configured to move the second magnet to a position substantially axisymmetrical about an exposure optical axis.

Still another aspect of the present invention provides a control method for an exposure apparatus including a table configured to be movable on a base guide in a first direction and to place a reticle thereon, a repulsion force generation unit having a first magnet provided to an end of the table in the first direction, and a second magnet provided to an end of the base guide in the first direction, thereby exerting a repulsion force generated by the first and second magnets upon the table at an end of a moving stroke of the table in the first direction, and a driving unit configured to reciprocally drive the table in the first direction while the repulsion force generation unit exerts the repulsion force upon the table. The method comprises the steps of moving the table to a change operation position in order to change a reticle, and retreating the second magnet to a position, after the table moves to the change operation position in the moving step, where the repulsion force generated by the first and second magnets do not act upon the table.

Further features of the present invention will become apparent from the following description of exemplary embodiments with reference to the attached drawings.

BRIEF DESCRIPTION OF THE DRAWINGS

FIGS. 3A to 3F are views for explaining a control process in reticle change in the embodiment;

FIG. 4 is a flowchart to explain device manufacture using the exposure apparatus;

DESCRIPTION OF THE EMBODIMENTS

Various exemplary embodiments, features, and aspects of the present invention will be described in detail below with reference o the drawings.

First Embodiment

Figure 1:
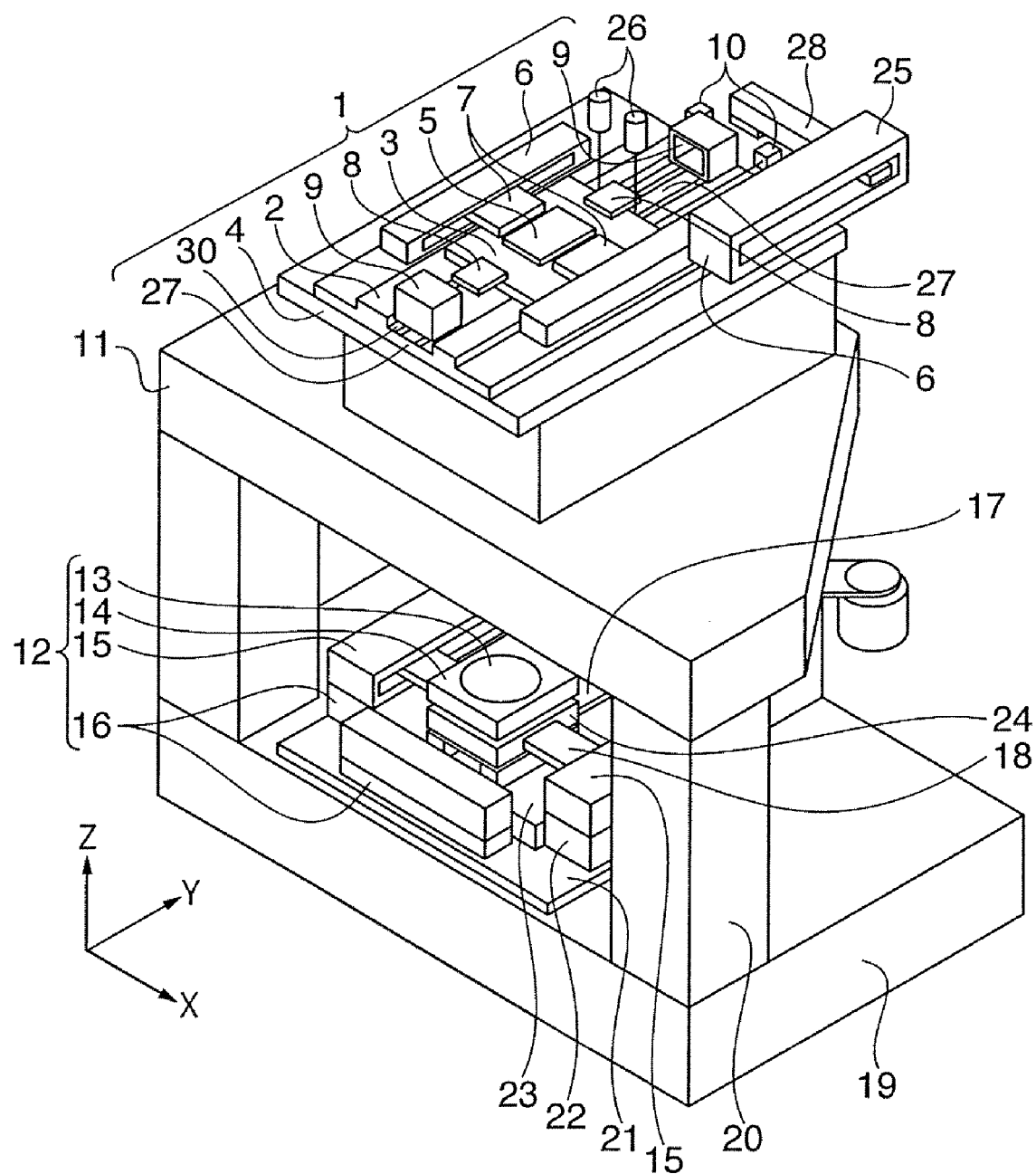
FIG. 1 is an upper perspective view of an exposure apparatus according to an embodiment.

FIG. 1 is an upper perspective view of an exposure apparatus according to this embodiment.

This exposure apparatus has an exposure light source, optical illumination system, and reduced projection system (neither is shown), and a reticle stage 1 and wafer stage 12.

The reticle stage 1 includes a base 2, a table 3 for mounting a reticle 5 thereon, linear motor stators 6 and linear motor movable elements 7 which constitute linear actuators, and the like. The table 3 is configured to be reciprocally movable on the base 2 in the Y direction. More specifically, the reticle stage 1 has the following arrangement.

A static pressure air bearing (not shown) levitates the table 3 by about 5 μm above the base guide 2. The linear motor movable elements 7 with magnets adhered to them are fixed on the two sides of the table 3. The linear motor stators 6 are arranged on the two sides of the table 3 to sandwich the linear motor movable elements 7 in the Z direction. A plurality of coils are arranged in each linear motor stator 6 in the Y direction. When supplying a current to a predetermined coil in the linear motor stator 6 in accordance with the position of the corresponding linear motor movable element 7, the Lorentz force is generated to obtain a thrust in the Y direction.

Figure 8A:
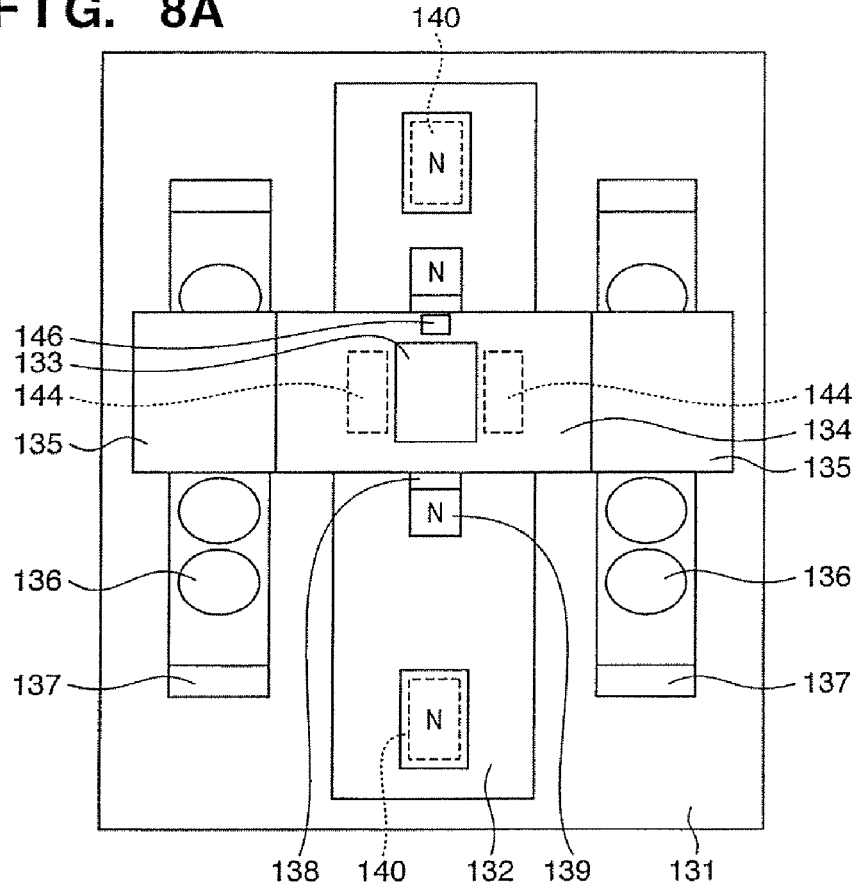
FIG. 8A is a plan view of a moving stage apparatus comprising a conventional repulsion accelerating means.
Figure 8B:
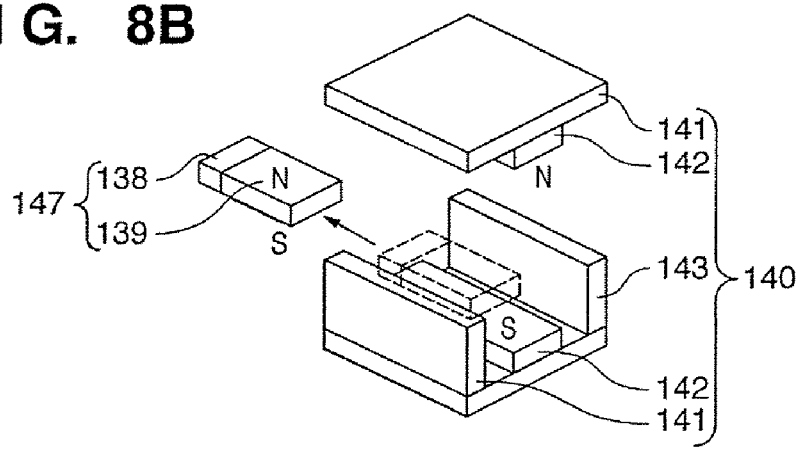
FIG. 8B is a perspective view showing the arrangement of a repulsion magnet unit.

Movable magnets 8 serving as the movable portions of repulsion magnet units are set in front of and behind the table 3. Each movable magnet 8 is formed of a plate-like unipolar permanent magnet magnetized in the vertical direction. Fixing portions 9 of the repulsion magnet units are fixed on the two ends of the base 2 in the Y direction. The arrangements of the fixing portions 9 can be identical to those of the repulsion stators 140 shown in FIG. 8B. When the movable magnet 8 enters the corresponding fixing portion 9, they react with each other to generate a repulsion force in the table 3 to accelerate or decelerate the table 3.

Laser interferometers 10 are also fixed to the rear end in the Y direction of a lens barrel supporting member 11 which fixes the reduced projection system (not shown). A mirror (not shown) provided to the table 3 reflects laser beams coming from the laser interferometers 10 to measure the position of the table 3 in the Y direction.

According to this embodiment, the wafer stage 12 located under the reticle stage 1 has a separate fine moving unit and coarse moving unit. The fine moving unit has a table 14 on which a wafer substrate 13 is placed, a magnetic levitating mechanism (not shown), a fine moving mechanism comprising a linear motor or the like, and a position measurement mechanism such as a laser interferometer. The fine moving unit is capable of posture control while it is isolated from the vibration of a center slider 24. The coarse moving unit has an exposure stroke that can cover almost the entire region of the wafer substrate 13. The coarse moving unit can move the center slider 24 while a static pressure bearing levitates the center slider 24 by about 5 μm above a base 23. Linear motors 15 are connected to the center slider 24 through beams 17 and 18 to drive the center slider 24 in the X and Y direction.

According to this embodiment, the movable magnets 8 are set at the two ends of the table 3 in the Y direction, and the fixing portions 9 are fixed and held on a guide rail 27 which is set in a recess 30 formed in the base 2. When released, the fixing portions 9 can move along the guide rail 27. It suffices if the fixing portions 9 are fixed and held with a holding force that can withstand the reaction force acting on the fixing portions 9 when the repulsion magnet units receives the kinetic energy generated upon reciprocal movement of the table 3. For example, a piezoelectric element may apply a voltage to the guide rail 27 to extend or contract it, thereby fixing the fixing portions 9 by friction. The use of a known driving motor or the like can realize movement of the fixing portions 9 along the guide rail 27. For example, an encoder incorporated in the driving motor can detect the positions of the fixing portions 9.

The reticle stage 1 is provided with a reticle changer 25, which can mount a reticle on it and can change it, outside of one linear motor stator 6 in the X direction. The reticle changer 25 supports an arm 28 extending toward the inner center in the X direction. The arm 28 has a movable stroke that enables transfer of the reticle between a reticle stocker (not shown), which temporarily stores the reticle, and the reticle stage 1. The reticle changer 25 supports the arm 28 and comprises an actuator such as a linear motor.

A method of accelerating the reticle stage 1 in reciprocal driving will be described. Usually, in the initial state, the table 3 is located in a region where the repulsion force generated by the repulsion accelerating magnets does not act. In this state, a current is supplied to the coils in the linear motor stators 6 in accordance with the positions of the linear motor movable elements 7. This gives to the table 3 a thrust in, for example, the (+) direction to move it, and the movable magnet 8 of one repulsion magnet unit enters the fixing portion 9 of the repulsion magnet unit located at the stroke end. As the entering amount of the movable magnet 8 into the fixing portion 9 of the repulsion magnet unit increases, the table 3 decelerates. Eventually, when the speed of the table 3 becomes 0 and the entering amount of the movable magnet 8 becomes a maximum, the table 3 reverses its moving direction and starts moving in the (−) direction. As the entering amount of the movable magnet 8 decreases, the table 3 accelerates.

When the movable magnet 8 is separate from the fixing portion 9 by a certain degree, the repulsion force becomes zero. At this time, the table 3 has been accelerated to the maximum speed and guided by the static pressure air bearing, so it moves to the opposite side at an almost constant speed. Then, the linear motor can accelerate the table 3 in the (−) Y direction. By repeating these operations, the table 3 can be accelerated gradually so its speed in the state where it does not accelerate and decelerate by the repulsion magnet unit (that is, the constant-speed state) increases to reach the scanning speed for exposure.

In the reticle state using the magnet repulsion force generating unit as described above, it takes time until the speed increases to the scanning speed for exposure. Once the constant-speed driving is started, the energy necessary to maintain the speed constant is limited to the amount that compensates for a decrease in speed caused by a loss or the like due to air resistance acting on the table 3 when the table 3 moves. Therefore, to improve the throughput, once the reticle stage 1 reaches the constant-speed state, it is desired to maintain the speed regardless of the operation state of the wafer stage 12.

Figure 2:
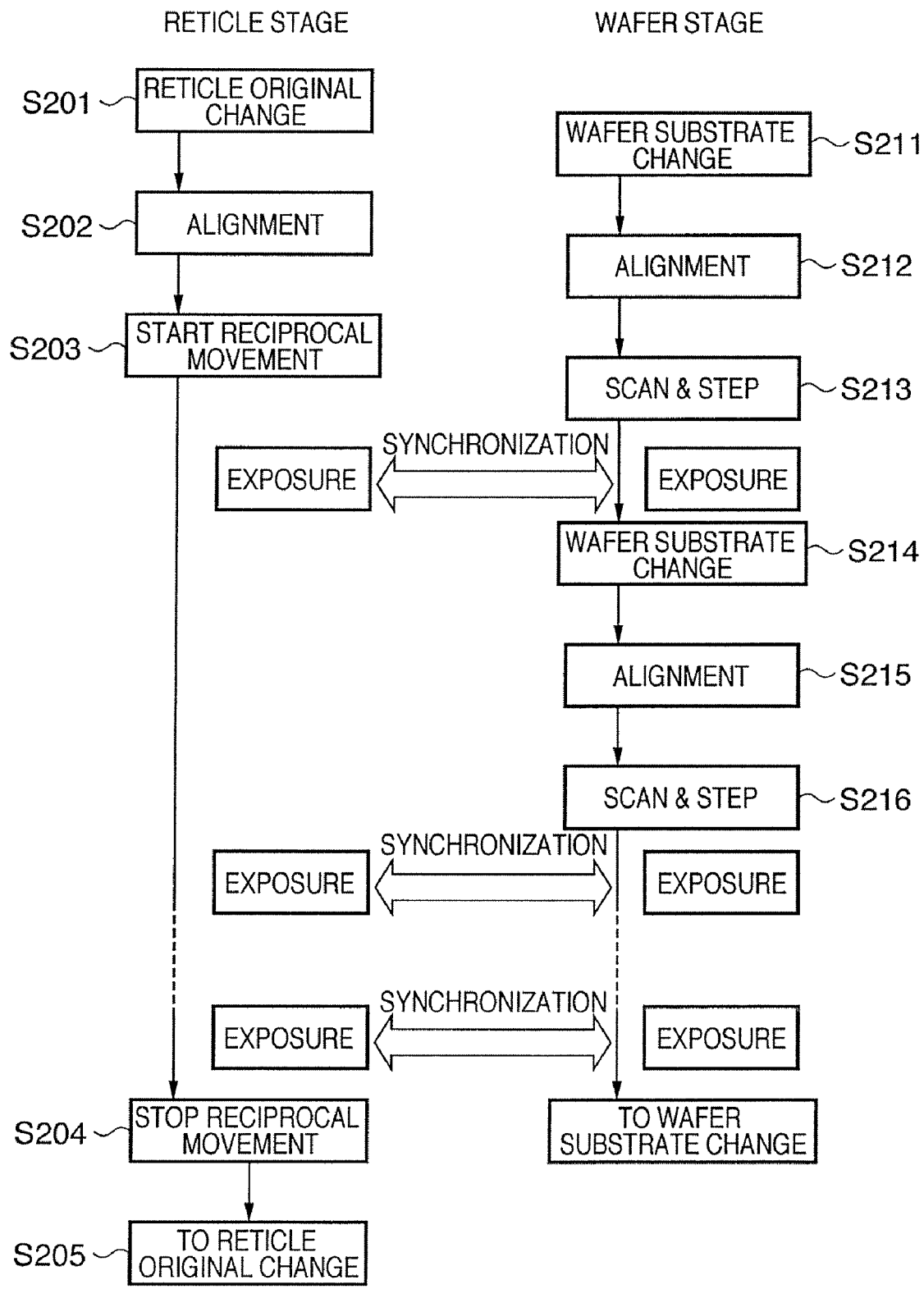
FIG. 2 is a flowchart showing control operation during exposure of the exposure apparatus according to the embodiment.

FIG. 2 is a driving flowchart of the reticle stage 1 and wafer stage 12 described above. The sequence on the left in FIG. 2 is the operation sequence covering from reticle change to the next reticle change on the reticle stage 1. The sequence on the right in FIG. 2 is the operation sequence of the wafer stage 12 which is executed in synchronism with the operation of the reticle stage 1 and includes a plurality of times of wafer substrate change, and is presented to show the correspondence in timing with the operation sequence of the reticle stage 1.

In the reticle stage 1, after reticle change (S201), a sensor (not shown) recognizes the holding position information of the reticle 5 (S202). The reticle stage 1 increases its speed until the scanning speed while reciprocating based on the accelerating method described above (S203).

In the wafer stage 12, after wafer substrate change (S211), a sensor performs alignment measurement of recognizing the holding position information and surface shape state information of the wafer substrate (S212). After that, the posture of the table 14 on the wafer stage 12 is controlled based on the information obtained in the alignment measurement, and the table 14 is scanned for exposure while maintaining synchronism with the reticle stage 1. Furthermore, step driving to shift the exposure location on the wafer substrate 13 is repeated to sequentially expose the surface of the wafer substrate 13 (S213). When this exposure is ended, the wafer stage 12 repeats a series of operations of wafer change (S214), alignment measurement (S215), and similar exposure (S216). During this period of time, the reticle stage 1 continues reciprocal movement during wafer substrate change (S214) and alignment measurement (S215) as well, to maintain the speed in the constant-speed state at the scanning speed for exposure. Prior to the next reticle change (S205), the reciprocal movement of the reticle stage 1 is stopped (S204).

This embodiment exemplifies a case wherein the speed in the constant-speed state is maintained at the scanning speed for exposing the pattern of the reticle 5 onto the wafer substrate 13. As far as the throughput can be improved similarly, the speed may be changed. For example, if the speed can be increased to reach the scanning speed in time for exposure, when performing wafer substrate change on the wafer stage 12, the wafer stage 12 may be reciprocally moved such that the speed in the constant-speed state is lower than the scanning speed. Alternatively, if the speed of the wafer substrate 13 can be increased in alignment measurement by reciprocal movement to reach the scanning speed in time for exposure, when performing wafer substrate change on the wafer stage 12, the reticle stage 1 may be stopped.

If merely setting the speed in the constant-speed state to the scanning speed for exposure, the timings of the two stages to start scanning for exposure may differ, and the reticle stage 1 may have to stand by for almost one reciprocal movement. For this reason, the timings of the two stages to start scanning for exposure must be synchronized. Hence, stage position measurement is performed using the laser interferometers or the like respectively provided to the reticle stage 1 and wafer stage 12. The measurement data must be calculated, and the driving states of the two stages must be adjusted by a sequence that synchronizes the two stages based on the position information and speed information of the two stages obtained by the calculation.

From the foregoing, driving of the reticle stage 1 and wafer stage 12 can improve the throughput of the exposure apparatus having the reticle stage using a magnet repulsion force generating unit that copes with a high speed.

A control process in reticle change according to this embodiment will be explained.

FIGS. 3A to 3F are views showing a reticle stage portion in the exposure apparatus shown in FIG. 1, in which FIGS. 3A and 3C are plan views, and FIGS. 3B and 3D are sectional views taken along the lines A-A shown in FIGS. 3A and 3C, respectively. FIGS. 3E and 3F show a state in which the table 3 and fixing portions 9 have been moved from the state shown in FIG. 3D.

Referring to FIGS. 3A to 3F, alignment scopes 26 and the arm 28 of the reticle changer 25 are added to a lens unit 29 of the optical illumination system. The alignment scopes 26 recognize the holding position information of the reticle 5 which is placed by the arm 28. This information is fed back to drive the reticle stage 1 and wafer stage 12.

The example of FIGS. 3A and 3B shows a state wherein the table 3 is located at a predetermined reticle change position and the arm 28 of the reticle changer 25 is located at the position to transfer a reticle with a reticle stocker (not shown). Note that the fixing portion 9 (the right fixing portion 9 in FIGS. 3A and 3B) of the repulsion magnet unit on a side where reticle change is to take place has retreated to the rear end position in the Y direction. Thus, at this reticle change operation position, the repulsion force against the movable magnet 8 hardly acts. Therefore, no mechanism need be provided to hold the table 3 against the repulsion force.

The arm 28 which has received the reticle 5 from the reticle stocker moves to the position on the table 3 as shown in FIGS. 3C and 3D, and places the reticle 5 on the table 3. Then, the reticle stage 1 moves the table 3 to the position shown in FIG. 3E by driving the linear motor stators 6. At this time, the alignment scopes 26 recognize the position information of the table 3 based on an alignment mark formed on the reticle 5.

Subsequently, as shown in FIG. 3F, the linear motor stators 6 further move the table 3 to a predetermined reference position for the exposure operation. At this time, one fixing portion 9 (the right fixing portion 9 in the case shown in FIG. 3F) is restored (with a moving amount L1) along the guide rail 27 to a position of a stroke necessary to expose and transfer the pattern drawn on the reticle 5 onto the wafer substrate 13, and is fixed and held there.

After that, the reciprocal movement of the table 3 in the sequence of FIG. 2 described above is started (step S203). The reciprocal movement of the table 3 can be started while moving the fixing portion 9. If the fixing portion 9 can be held and fixed since the table 3 starts moving by reciprocal movement until returning to the fixing portion 9, the acceleration time can be utilized effectively.

In this manner, according to this embodiment, when the reticle changer 25 performs reticle change, the fixing portion 9 of the repulsion magnet unit can be retreated so the repulsion force does not act on the table 3 at the reticle change position. Thus, the repulsion magnet unit does not limit the movable range of the stage, and the reticle change can be facilitated. Furthermore, this facilitates design of the arm 28 of the reticle changer 25.

If not only the fixing portion 9 on the reticle change side but also the fixing portion 9 (the left fixing portion 9 in the drawings) of the opposing repulsion magnet unit is movable, the reciprocal movement stroke can be set in accordance with the scanning widths of different field angles. The reciprocal movement stroke is expressed by {L2+(the entering amount of the movable magnet 8 into the fixing portion 9 of the repulsion magnet unit)}×2. At this time, to minimize the stroke, the holding/fixing positions of the pair of repulsion magnet units may be set at positions almost linearly symmetric about an exposure optical axis (L2/2≈L3, L2/2≈>L4). This is due to the following reason. Since scanning for exposure is generally performed about the exposure optical axis as the center, the stroke becomes minimum when the distances from the position of the center of optical axis of the exposure light to the two fixing portions 9 are equal.

Second Embodiment

An embodiment of a device manufacturing method which utilizes the exposure apparatus described above will be explained with reference to FIGS. 4 and 5. FIG. 4 is a flowchart to explain the manufacture of a device (a semiconductor chip such as an IC or LSI, a LCD, a CCD, or the like). The device manufacturing method will be exemplified by a semiconductor chip manufacturing method.

In step S1 (circuit design), the circuit of a semiconductor device is designed. In step S2 (mask fabrication), a mask is fabricated based on the designed circuit pattern. In step S3 (wafer manufacture), a wafer is manufactured using a material such as silicon. In step S4 (wafer process) called a pre-process, the above exposure apparatus forms an actual circuit on the wafer by lithography using the mask and wafer. In step S5 (assembly) called a post-process, a semiconductor chip is formed using the wafer manufactured in step S4. This step includes processes such as assembly (dicing and bonding) and packaging (chip encapsulation). In step S6 (inspection), inspections such as operation check test and durability test of the semiconductor device formed in step S5 are performed. A semiconductor chip is finished with these steps and shipped (step S7).

Figure 5:
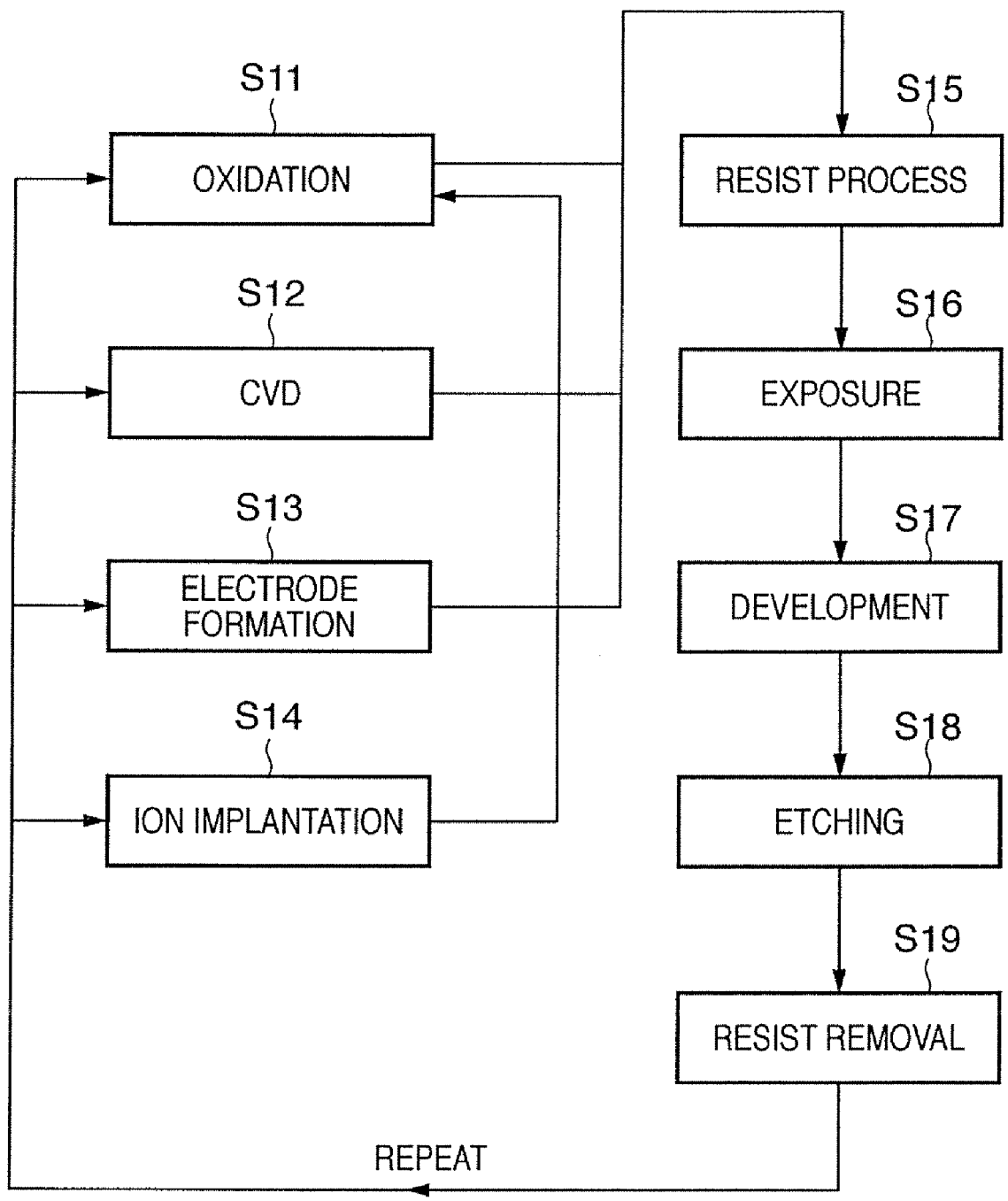
FIG. 5 is a detailed flowchart of a wafer process in step S4 of the flowchart in FIG. 4.
Figure 6:
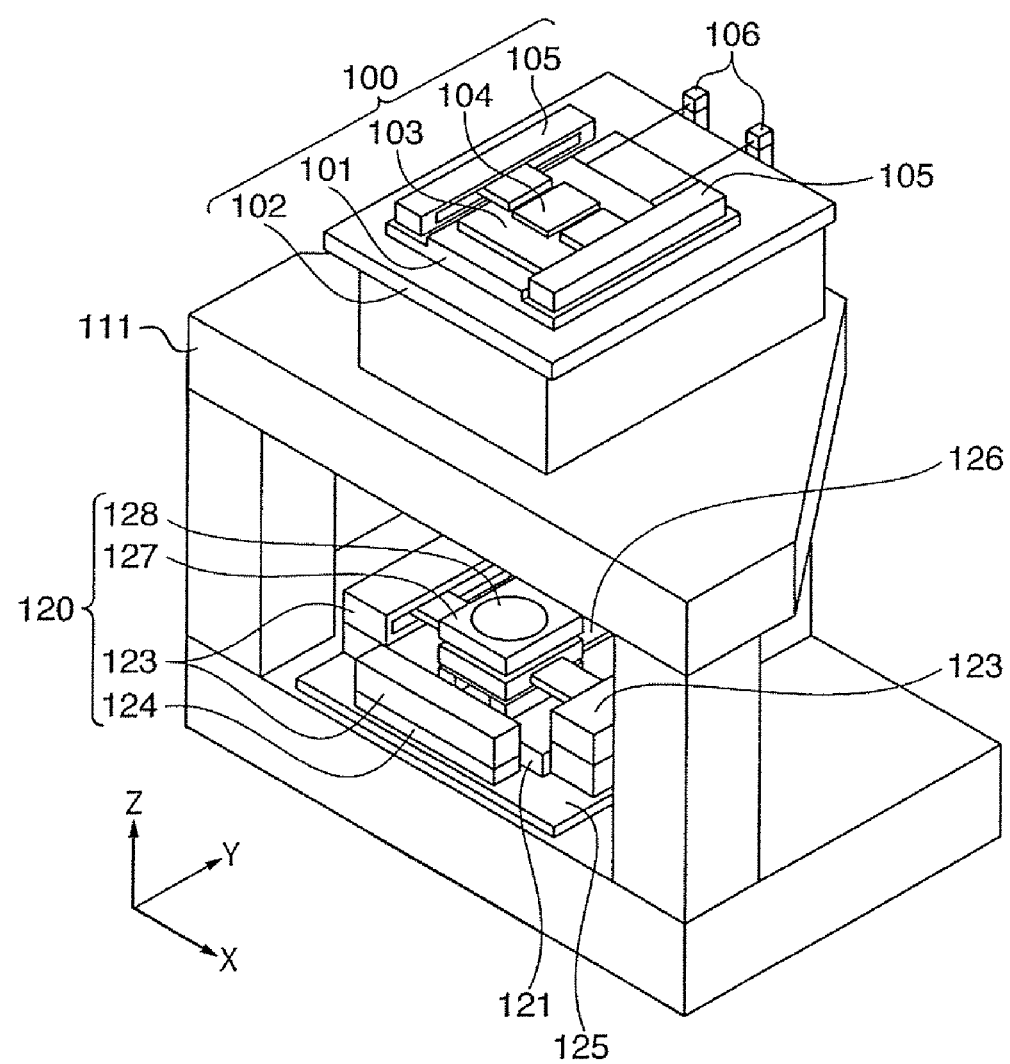
FIG. 6 is an upper perspective view of a conventional scanning exposure apparatus.
Figure 7:
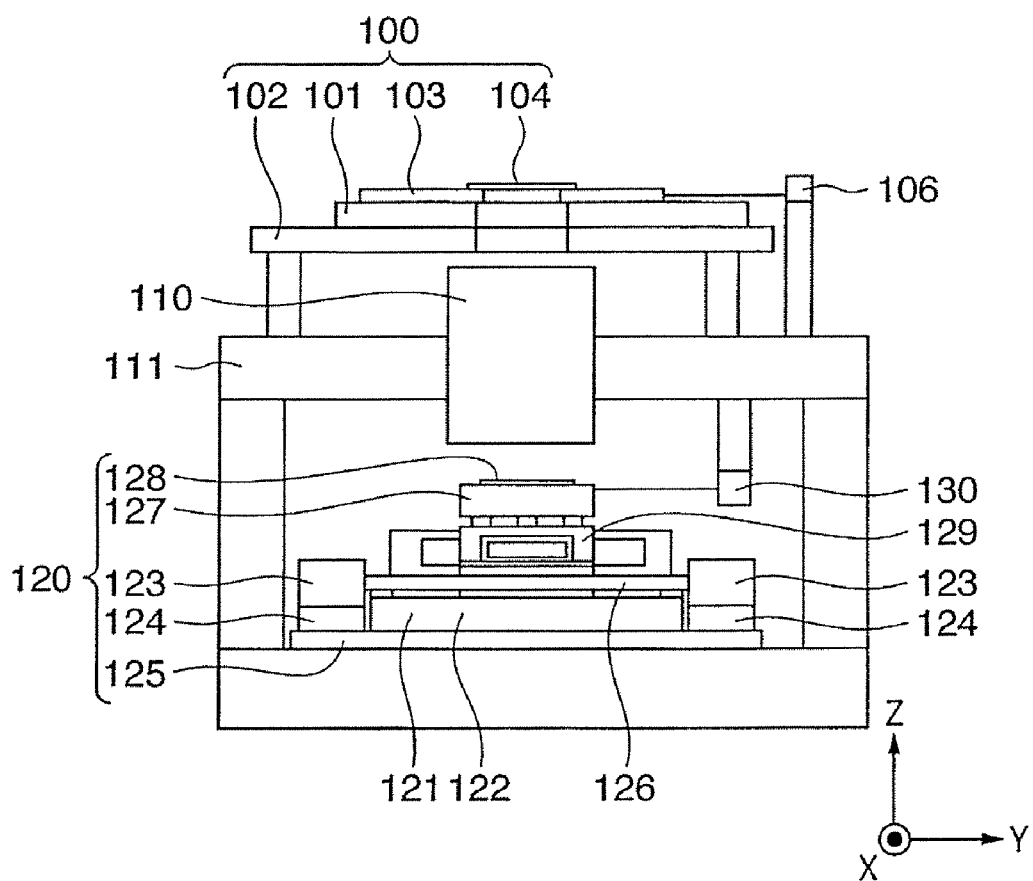
FIG. 7 is a sectional view taken along the Y-Z plane of the scanning exposure apparatus in FIG. 6.

FIG. 5 is a detailed flowchart of the wafer process of step S4. In step S11 (oxidation), the surface of the wafer is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist process), a photosensitive agent is applied to the wafer. In step S16 (exposure), the exposure apparatus exposes the circuit pattern of the mask onto the wafer. In step S17 (development), the exposed wafer is developed. In step S18 (etching), portions other than the developed resist image are etched. In step S19 (resist removal), any unnecessary resist after etching is removed. By repeating these steps, multilayered circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-327630, filed Dec. 4, 2006, which is hereby incorporated by reference herein in its entirety.

What is claimed is:

1. An exposure apparatus comprising:
a table configured to be movable on a base guide in a first direction and to place a reticle thereon;
a repulsion force generation unit having a first magnet provided to an end of said table in the first direction, and a movable second magnet provided to an end of said base guide in the first direction, thereby exerting a repulsion force generated by said first and second magnets upon said table at an end of a moving stroke of said table in the first direction;
a driving unit configured to reciprocally drive said table in the first direction while said repulsion force generation unit exerts the repulsion force on said table; and
a control unit configured to retreat said second magnet to a position where the repulsion force generated by said first and second magnets do not act upon said table when moving said table to a change operation position for changing a reticle.

2. An apparatus according to claim 1, further comprising a holding unit configured to fix and hold said second magnet moved by said control unit.

3. An apparatus according to claim 1, wherein the change operation position is where a reticle changer which changes the reticle automatically works.

4. An apparatus according to claim 1,
wherein said first magnet comprises first magnets respectively provided to two ends of said table in the first direction, and said second magnet comprises second magnets respectively provided to two ends of said base guide in the first direction, and
said control unit further moves said table to a reference position to perform exposure operation after change of the reticle is ended, restores said second magnets to a position where said repulsion force generation unit exerts the repulsion force upon said table, and adjusts said second magnets at positions substantially axi-symmetrical about an exposure optical axis.

5. An exposure apparatus comprising:
a table configured to be movable on a base guide in a first direction and to place a reticle thereon;
a repulsion force generation unit having first magnets respectively provided to each end of said table in the first direction, and movable second magnets respectively provided to each end of said base guide in the first direction, thereby exerting a repulsion force generated by said first and second magnets upon said table at each end of a moving stroke of said table in the first direction;
a driving unit configured to reciprocally drive said table in the first direction while said repulsion force generation unit exerts the repulsion force upon said table; and
a control unit configured to move said second magnets to positions substantially axi-symmetrical about an exposure optical axis.

6. A control method for an exposure apparatus including:
a table configured to be movable on a base guide in a first direction and to place a reticle thereon;
a repulsion force generation unit having a first magnet provided to an end of the table in the first direction, and a second magnet provided to an end of the base guide in the first direction, thereby exerting a repulsion force generated by the first and second magnets upon the table at an end of a moving stroke of the table in the first direction, and
a driving unit configured to reciprocally drive the table in the first direction while the repulsion force generation unit exerts the repulsion force upon the table,
said method comprising the steps of:
moving the table to a change operation position in order to change a reticle; and
retreating the second magnet to a position, after the table moves to the change operation position in said moving step, where the repulsion force generated by the first and second magnets do not act upon the table.

7. A device manufacturing method comprising the steps of:
exposing a wafer using an exposure apparatus according to claim 1; and
developing the wafer.

* * * * *